(12) United States Patent
Ulrich

(10) Patent No.: US 6,675,465 B2
(45) Date of Patent: Jan. 13, 2004

(54) PICK-UP TOOL

(75) Inventor: René Josef Ulrich, Weggis (CH)

(73) Assignee: ESEC Trading SA, Cham (CH)

( * ) Notice: Subject to any disclaimer, the term of this patent is extended or adjusted under 35 U.S.C. 154(b) by 100 days.

(21) Appl. No.: 09/896,372

(22) Filed: Jun. 28, 2001

(65) Prior Publication Data

US 2003/0029029 A1 Feb. 13, 2003

(30) Foreign Application Priority Data

Jul. 3, 2000 (CH) ............................................. 1309/00

(51) Int. Cl.⁷ ............................................. B23P 19/00
(52) U.S. Cl. .......................................... 29/743; 29/569
(58) Field of Search ..................... 29/569, 743; 269/21, 269/329; 451/388; 279/3

(56) References Cited

U.S. PATENT DOCUMENTS 4,290,732 A * 9/1981 Taki et al. .................. 414/752
5,898,167 A * 4/1999 Musha et al. ............. 250/201.5
6,435,492 B1 * 8/2002 Behler et al. .................. 269/21

FOREIGN PATENT DOCUMENTS

| EP | 0 298 564 | 6/1988 | ........... H01L/21/00 |
| EP | 0 456 426 A1 | 3/1991 | ........... H01L/21/00 |

* cited by examiner

Primary Examiner—Denise L. Esquivel
Assistant Examiner—Melvin Jones
(74) Attorney, Agent, or Firm—Thelen Reid & Priest LLP; Masako Ando

(57) ABSTRACT

A pick-up tool for the mounting of semiconductor chips onto a substrate has a suction device which consists of a plate made out of a dimensionally stable material one surface of which has structures made of hardened adhesive. The material for the plate is, for example, aluminum, a carbon fiber composite material or a dimensionally stable plastic. A suitable material for the structure is, for example, an adhesive which has Teflon® as the filing material.

24 Claims, 2 Drawing Sheets

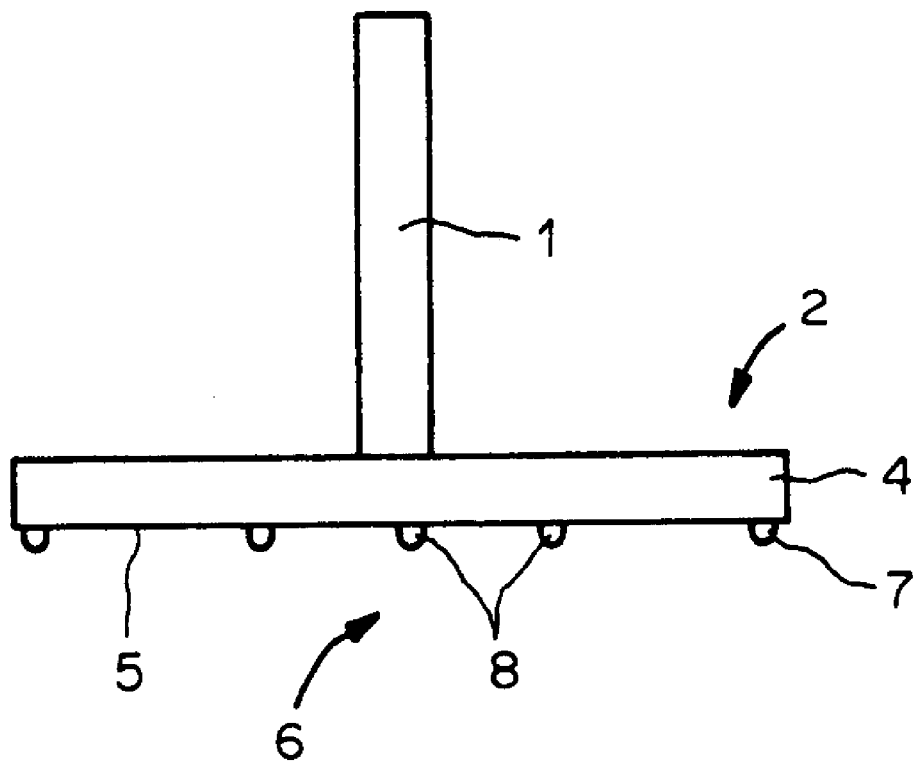

PICK-UP TOOL

PRIORITY CLAIM

The present application claims priority under 35 U.S.C. §119 based upon Swiss Application No. 2000 1309/00, filed on Jul. 3, 2000.

FIELD OF THE INVENTION

The present invention concerns a pick-up tool for the mounting of semiconductor chips onto a substrate. More particularly, the present invention relates to such pick-up tools known under the technical terms "die collet" or "die bonding tool".

BACKGROUND OF THE INVENTION

With the mounting of semiconductor chips, the semiconductor chips sawn out of a wafer and stuck to a foil are grasped by a pick-up tool and placed onto a substrate. Such a pick-up tool basically consists of a metal shaft and a suction device secured to it which has a cavity directed towards the component to be grasped to which vacuum can be applied via a drill hole. As soon as the suction device rests on the component, the vacuum effects the adhesion of the component to the suction device.

The attachment of the semiconductor chips to the substrate takes place with differing adhesive materials depending on the area of application. Apart from soft solder, with which the semiconductor chip is soldered to the substrate, and adhesive tape, mainly electrically conducting, silver incorporating as well as non-conducting liquid adhesives with an epoxy base are used. Recently however, adhesives have become known which are based on new molecular systems which harden in relatively shorter times. On the one hand, the adhesive layer must guarantee the adhesion of the semiconductor chip to the substrate, on the other hand it must be capable of compensating the shearing stresses which are caused for example by temperature fluctuations. Because the characteristics of the named adhesives are greatly dependent on the layer thickness, a constant adhesive layer thickness within tight limits is required in order to be able to produce reliable products with identical characteristics.

Also, in order to avoid the slightest damage to the semiconductor chips during mounting, pick-up tools are used whose suction device consists of rubber. Rubber has the additional advantage that it effectively seals the hollow chamber so that the semiconductor chip can be detached from the foil with a relatively large suction force.

These rubber tools however have the serious disadvantage that they cannot be manufactured with sufficient precision. The rubber tools are generally 2 to 3 mm thick. Expensive injection tools are necessary for manufacture. Nevertheless, the finished rubber tools have thickness deviations of 50 μm and more. As a result, problems occur especially with the mounting of relatively large semiconductor chips, i.e., semiconductor chips with an edge length of 20 mm and more because the adhesive is badly distributed underneath the semiconductor chip, contains air bubbles, does not flow everywhere as far as the edges of the semiconductor chips, has irregular thickness, etc.

The object of the invention is to develop a pick-up tool which enables the perfect mounting of large semiconductor chips.

BRIEF DESCRIPTION OF THE INVENTION

Solving of the task is achieved in accordance with an embodiment of the invention in that the pick-up tool has a suction plate made out of dimensionally stable material the surface of which facing towards the semiconductor chip has structures made of a curable adhesive. An adhesive proven and accepted in the semiconductor industry serves as the adhesive. The suction plate guarantees the rigidity or dimensional stability of the pick-up tool. The structures made of cured adhesive guarantee the necessary elasticity so that the semiconductor chip is not scratched and so that the cavity formed between the pick-up tool and the semiconductor chip is vacuum sealed.

In the following, an embodiment of the invention is explained in more detail based on the drawing.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 2 is a diagram schematically illustrating a cross-sectional view of a pick-up tool in accordance with an embodiment of the present invention.

DETAILED DESCRIPTION

Figure 1:
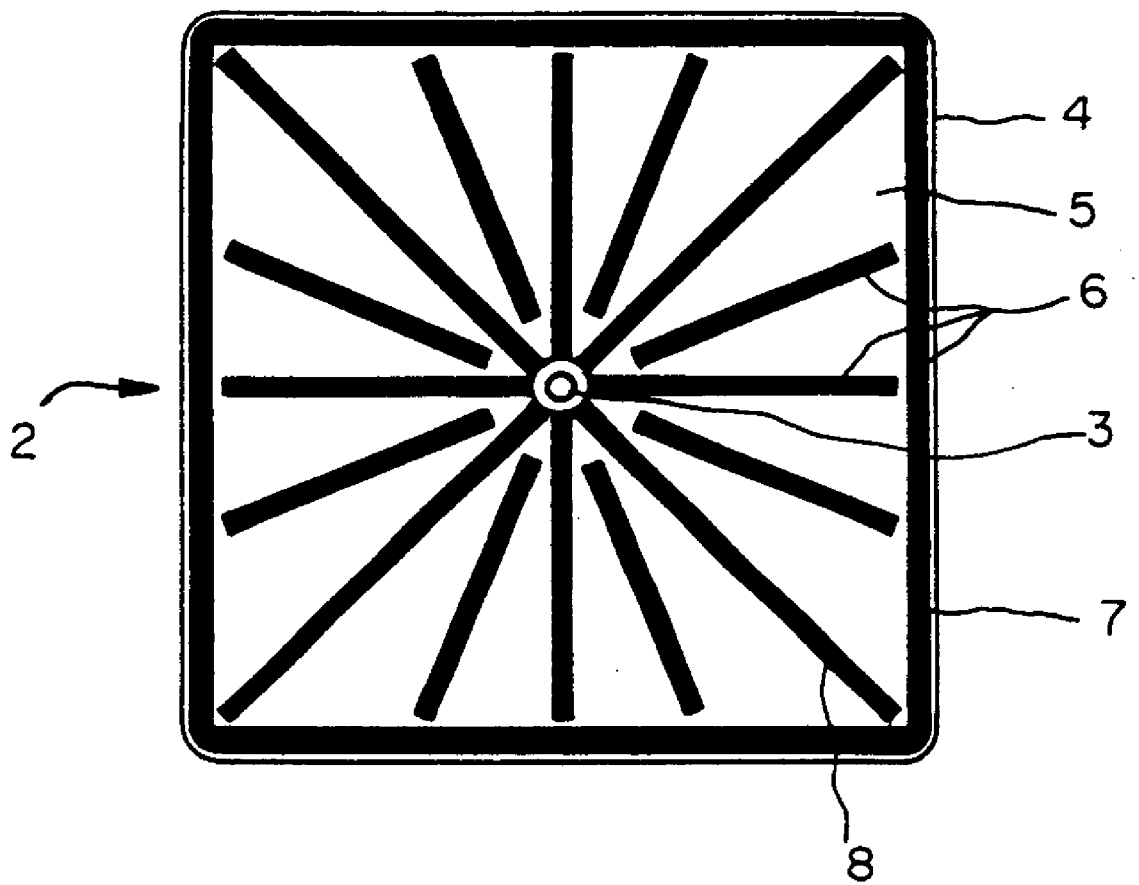
FIG. 1 is a diagram schematically illustrating a plan view of a pick-up tool in accordance with an embodiment of the present invention.

Embodiments of the present invention are described herein in the context of a pick-up tool. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

FIGS. 1 and 2 show a plan view and a cross-section of a pick-up tool which comprises a shaft 1 and a suction plate 2 made of dimensionally stable material as the actual suction device in accordance with an embodiment of the present invention. The shaft 1 is formed so that the suction plate 2 is held stable and at right angles to the longitudinal axis of the shaft 1. Preferably, the suction plate 2 is not just pushed onto the shaft 1 but in addition is fixed with a fast setting thermal adhesive. The suction plate 2 has a drill hole 3 in the centre which, via the shaft 1, can be connected to a vacuum source.

The suction plate 2 consists of an approximately two millimeter thick dimensionally stable plate 4 one surface 5 of which has structures 6 made out of a material proven in the semiconductor industry. Preferably, anodized aluminum serves as the material for the plate 4. Compared with non-anodized aluminum, anodized aluminum offers the advantage of corrosion resistance. The plate 4 can however also be manufactured from a carbon fiber composite material or a dimensionally stable plastic. A plate 4 made of plastic can be economically manufactured for example with the injection moulding process. Carbon fiber composite materials as well as plastics demonstrate the advantage of low weight at sufficient or even greater dimensional stability as compared with metals. A fast setting adhesive serves as the material for the structure 6 which preferably contains a large portion of syntheticresinousfluorine or polytetrafluoroethylene sold under the trademark TEFLON® as filling material. Such a material is available, for example, from the company Dexter under the designation QM1536. The material QM1536 is an electrical isolator and has a modulus of elasticity of 300 Mpa. The structures 6 are therefore sufficiently elastic so that they do not scratch the semiconductor chip. It is also possible to use an electrically conducting adhesive for the structures 6 which, in operation, is connected to ground either directly or via, in this case preferably, the non-anodized plate 4. A suitable material is available from Dexter under the designation QM1506. It contains silver as the filling material and has a modulus of elasticity of 630 MPa.

The aluminum plate 4 can be implemented in various colors. The anodized aluminum plate 4 offers an optimum surface for the structures 6. The structures 6 comprise a closed border line 7 as well as supporting lines 8 radiating out from the center of the aluminum plate 4. The height of the structures 6 amounts typically to around 0.2 mm. In order to achieve a high uniformity in the height of the structures 6, the adhesive is first applied with a writing head at a thickness of around 0.25 mm, hardened and then ground by around 0.05 mm parallel to the surface of the aluminum plate 4.

The border line 7 of the structures 6 has the task of sealing the vacuum zone formed by the aluminum plate 4, the border line 7 and the picked up semiconductor chip. The supporting lines 8 have the task of supporting the semiconductor chip and preventing the semiconductor chip from bending when placing it onto the substrate. Furthermore, the structures 6 must be made of a material which, on the one hand, excludes any damage to the semiconductor chip and, on the other hand, under no circumstances leaves residue on the chip surface.

The pick-up tool in accordance with the invention has the following advantages:

(1) The rigidity of dimensional stability of the pick-up tool is significantly higher than a customary pick-up tool with a suction device made of rubber. The supporting lines 8 prevent the semiconductor chip from bending when placing it onto the substrate. The adhesive therefore spreads evenly underneath the semiconductor chip and an adhesive layer of constant thickness is formed which is free of air bubbles.

(2) The structures 6 themselves do not adhere to the semiconductor chip. After switching off the vacuum, the semiconductor chip remains positionally accurate lying on the portion of adhesive applied to the substrate.

(3) The low height of the structures 6 has the result that the volume of the hollow chamber between the semiconductor chip and the aluminum plate 4 is very small so that the force build-up on creating the vacuum and the force reduction on releasing the vacuum take place very quickly.

(4) Slim and very light pick-up tools result even for the largest chip dimensions.

As long as the vacuum holding force is large enough, it is of advantage to size the dimensions of the pick-up tool smaller, typically around 70%, than the dimensions of the semiconductor chip. In this way, it can be achieved that the edge of the semiconductor chip, as seen from the center of the suction device, always deflects upwards. The result is a perfect spreading of the adhesive as far as the edges of the semiconductor chip as well as the subsequent development of the fillet with sufficient adhesive and without air bubbles.

The pick-up tool is also suitable for small semiconductor chips. However the supporting lines 8 can then be omitted.

While embodiments and applications of this invention have been shown and described, it would be apparent to those skilled in the art having the benefit of this disclosure that many more modifications than mentioned above are possible without department from the inventive concepts herein. The invention, therefore, is not to be restricted except in the spirit of the appended claims.

What is claimed is:

1. A pick-up tool with a suction device for the mounting of semiconductor chips onto a substrate, wherein the suction device is a plate made from a dimensionally stable material one surface of which has structures of a cured adhesive and wherein the structures comprise a border line.

2. A pick-up tool according to claim 1, wherein the structures further comprise supporting lines.

3. A pick-up tool according to claim 1, wherein the plate is made of aluminum.

4. A pick-up tool according to claim 3, wherein the structures further comprise supporting lines.

5. A pick-up tool according to claim 1, wherein the plate is made of aluminum, one surface of which is anodized.

6. A pick-up tool according to claim 5, wherein the structures further comprise supporting lines.

7. A pick-up tool according to claim 1, wherein the plate consists of carbon fiber composite material.

8. A pick-up tool according to claim 7, wherein the structures further comprise supporting lines.

9. A pick-up tool according to claim 1, wherein the plate consists of plastic.

10. A pick-up tool according to claim 9, wherein the structures further comprise supporting lines.

11. A pick-up tool for the mounting of semiconductor chips onto a substrate, said pick-up tool comprising:
a shaft; and
a suction device coupled to said shaft, the suction device including a plate made from a dimensionally stable material one surface of which has structures of a cured adhesive wherein said structures comprise a border line.

12. A pick-up tool according to claim 11, wherein said structures further comprise supporting lines.

13. A pick-up tool according to claim 11, wherein said plate is made of a material selected from the group consisting of aluminum, carbon fiber composite material, and plastic.

14. A pick-up tool according to claim 13, wherein said structures further comprise supporting lines.

15. A pick-up tool according to claim 11, wherein said plate is made of aluminum, one surface of which is anodized.

16. A pick-up tool according to claim 15, wherein said structures further comprise supporting lines.

17. A pick-up tool according to claim 11, wherein said plate has a drill hole in a center portion thereof, said drill hole is adapted to connect to a vacuum via said shaft.

18. A method for manufacturing a pick-up tool for mounting semiconductor chips onto a substrate, said pick-up tool including a suction plate and a shaft, said method comprising:

providing a plate made from a dimensionally stable material; and forming structures on a surface of the plate, by applying an adhesive with a writing head on the surface of the plate, hardening the adhesive, and grinding the hardened adhesive parallel to the surface of the plate.

19. A method according to claim 18, further comprising:

providing a shaft onto said plate so that the plate is held substantially right angles to a longitudinal axis of the shaft.

20. A method according to claim 18, wherein said structures comprise a border line.

21. A method according to claim 20, wherein said structures further comprise supporting lines.

22. A method according to claim 18, wherein said dimensionally stable material is selected from the group consisting of aluminum, carbon fiber composite material, and plastic.

23. A method according to claim 18, wherein said plate is made of aluminum and said surface of the plate is anodized.

24. A method for mounting semiconductor chips onto a substrate using a pick-up tool having a suction device, said suction device including a plate one surface of which has structures including a closed border line and supporting lines, said method comprising:

forming a vacuum zone enclosed by the plate, the border line, and a picked-up semiconductor chip;

supporting the semiconductor chip with the supporting line;

placing the semiconductor chip onto a substrate, the semiconductor chip being prevented from vending by the supporting lines;

allowing an adhesive to spread evenly underneath the semiconductor chip; and releasing the vacuum.

* * * * *